United States Patent [19]
Bell et al.

[11] Patent Number: 6,128,191
[45] Date of Patent: Oct. 3, 2000

[54] HEAT SINK WITH INTEGRAL SELF-LOCKING CLAMP

[75] Inventors: Michael R. Bell, Dallas; Kevin D. Jackson, Garland, both of Tex.

[73] Assignee: Lucent Technologies Inc., Murray Hill, N.J.

[21] Appl. No.: 09/196,730

[22] Filed: Nov. 20, 1998

[51] Int. Cl.[7] ...................................................... H05K 7/20
[52] U.S. Cl. .......................... 361/720; 165/80.2; 165/185; 174/16.3; 361/704; 361/710; 257/712; 257/718; 257/727
[58] Field of Search .................................. 165/80.2, 80.3, 165/185; 174/16.3; 257/706–707, 712–713, 718–719, 726–727; 361/688, 690, 704, 707, 709–710, 717–721

[56] References Cited

U.S. PATENT DOCUMENTS

| | | | |
|---|---|---|---|
| 4,203,488 | 5/1980 | Johnson et al. | 361/717 |
| 4,509,839 | 4/1985 | Lavochkin | 257/718 |
| 5,329,436 | 7/1994 | Chiu | 165/185 |

*Primary Examiner*—Gregory Thompson

[57] ABSTRACT

The present invention provides a heat sink for use with a heat-generating electrical component. The heat sink comprises a heat-conducting body having first and second opposing edges, and a clamping arm. The heat sink is configured to at least partially support the electrical, heat-generating component. The heat-conducting body further includes a receiving catch coupled to the first edge. The clamping arm has a first end hinged to the heat-conducting body at the second edge and a second end configured to cooperatively engage the receiving catch and maintain the clamping arm in a locked position.

25 Claims, 3 Drawing Sheets

HEAT SINK WITH INTEGRAL SELF-LOCKING CLAMP

TECHNICAL FIELD OF THE INVENTION

The present invention is directed, in general, to a heat sink and, more specifically, to a heat sink having an integral self-locking clamp and component alignment features.

BACKGROUND OF THE INVENTION

Today more than ever before, electronics designers must pack higher powered components closer together in ever-smaller spaces. More power in less space translates to increased power densities, and higher device operating temperature, thereby requiring increased heat dissipation. As temperatures rise, the reliability and functionality of electronic components are impaired dramatically. Experience has shown that more than 50 percent of electronic failures are the result of thermal problems. Traditionally, heat sinks are used to move heat from components generating the heat to an area where the heat can be dissipated to the atmosphere or adequate ventilation can he provided to the heat sink.

Most conventional heat sinks use sore form of mechanical method to attach the heat-generating component to the heat sink. The most common methods are: adhesives, spring clamping devices, or hold-down brackets with a mechanical fastener, such as a bolt. Adhesives have well known disadvantages associated with storage and handling. In those cases not employing adhesives, the heat sinks are usually made of two pieces: a main heat sink body, and a separate retaining clamp. In some cases, the clamp is a flat spring that at least partially surrounds the component and engages detents or notches in the main heat sink body. Alternatively, the retaining clamp may have a hook on one end that engages an aperture in the main body and is secured to the body by a machine screw. In these mechanical devices, the technician topically must assemble the parts and the component, or apply the adhesive by hand. This hand assembly often results in imprecise alignment of the component and the heat sink. Additionally, this hand alignment requires an appreciable amount of time, which slows down production and ultimately increases the cost of the assembly.

For those cases where the heat sink incorporates structural support features for the component, cooperative alignment of the heat sink and the component is essential so that the assembly readily aligns with the intended apertures on the printed wiring board (PWB). This alignment problem may be overcome by allowing some variability in locating the component on the heat sink, i.e., the component may be shifted laterally when in contact with the heat sink so as to align the leads and supports with the appropriate apertures on the PWB. Of course, this variability may lead to a loose junction between the component and the heat sink. While these fastening methods are adequate in retaining the component on the heat sink, there is a significant cost associated with the time it takes an assembler to make the mechanical attachment of the component to the heat sink.

Obviously, conventional heat sinks have been primarily designed with the principal areas of the heat problem and cost in mind. That is, other areas such as component alignment, board positioning, ease of manufacture, complexity of assembly, etc., have not had high importance indices.

Accordingly, what is needed in the art is a low-cost, easy-to-manufacture, and easy-to-assemble heat sink that incorporates component alignment, as well as solderable board positioning and component attachment features for electrical connectivity.

SUMMARY OF THE INVENTION

To address the above-discussed deficiencies of the prior art, the present invention provides a heat sink for use with a heat-generating electrical component. In one embodiment, the heat sink comprises a heat-conducting body having first and second opposing edges, and a clamping arm. The heat sink is configured to at least partially support the electrical, heat-generating component. The heat-conducting body further includes a receiving catch coupled to the first edge. The clamping arm has a first end hinged to the heat-conducting body at the second edge and a second end configured to cooperatively engage the receiving catch and maintain the clamping arm in a locked position.

In another embodiment, the heat sink further includes alignment bosses configured to receive and align the electrical, heat-generating component. In one aspect of this embodiment, the heat-conducting body has a mounting face that opposes the clamping arm when the clamping arm is in the locked position, and the alignment bosses are formed on the mounting face. In an alternative embodiment, the clamping arm has an interior face that opposes the heat-conducting body when the clamping arm is in the locked position, and the alignment bosses are formed on the interior face. However, the alignment bosses may be formed on both the heat-conducting body and the clamping arm.

In another aspect of the present invention, the heat-conducting body may also include a fiducial aperture configured to align the electrical heat-generating component in a position to cooperatively engage the plurality of alignment bosses.

The heat sink, in yet another embodiment, may include solderable alignment tangs configured to engage corresponding alignment apertures in a printed wiring board. In one advantageous embodiment, the heat sink may also comprise heat-dissipating fin.

In a particularly advantageous embodiment, the first end further includes a compliant hinge integrally formed with the heat-conducting body and the clamping arm. In yet another embodiment, the heat sink further includes alignment bosses and alignment tangs. The alignment bosses and alignment tangs are cooperatively positioned to align an electrical lead of the electrical component to a corresponding alignment aperture formed in a printed wiring board when the electrical component is retained by the heat sink. In still another embodiment, the heat-conducting body includes a body flute configured to stiffen the heat-conducting body, and allow the heat sink to be formed from the thinnest possible material. Alternatively or in conjunction with the body flute formed on the heat-conducting body, the clamping arm may include a clamping arm flute configured to stiffen the clamping arm. In one advantageous embodiment, the heat sink, including the heat-conducting body and the clamping arm, may be integrally formed from aluminum, copper, or steel.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
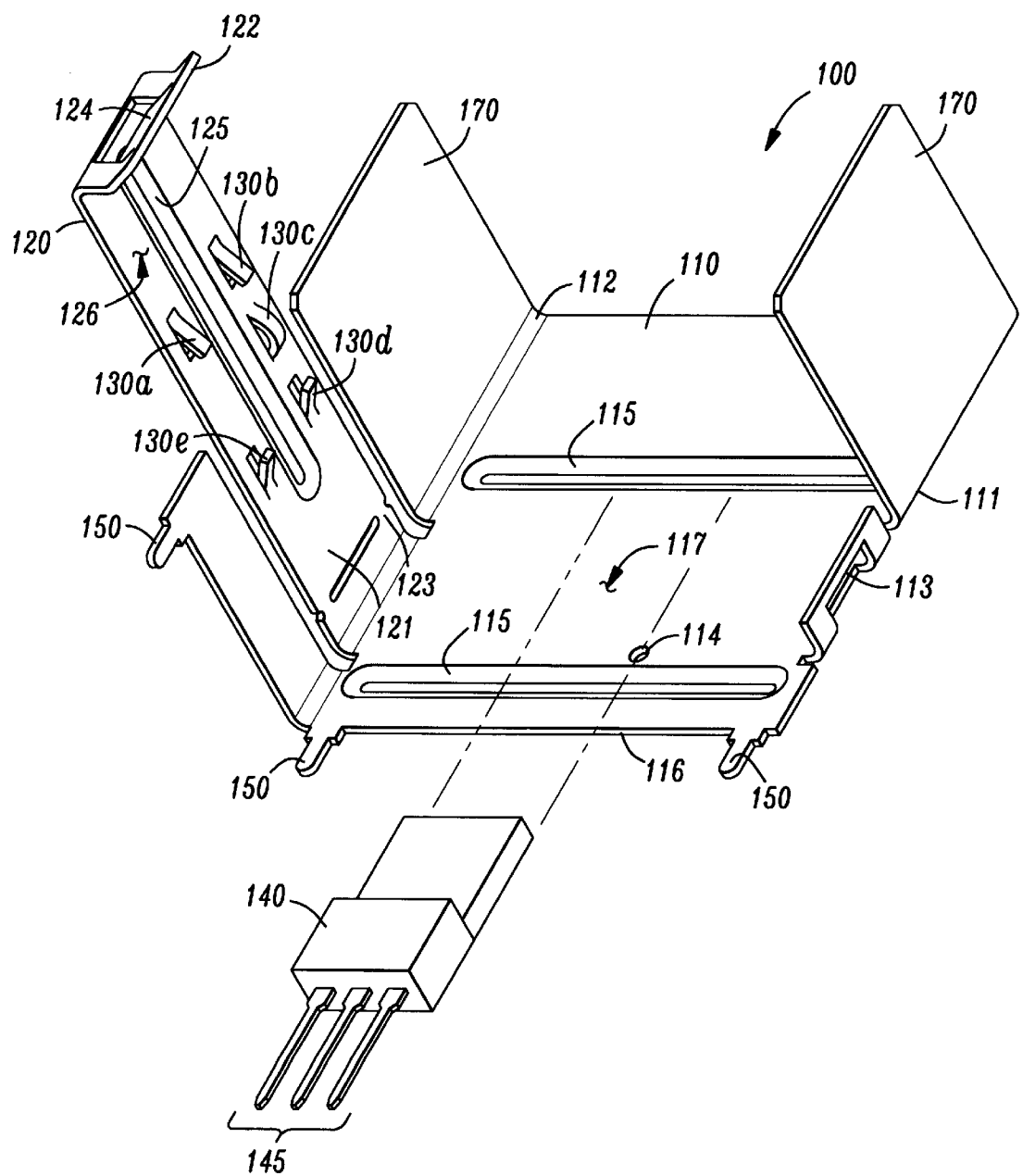
FIG. 1 illustrates an isometric view of one embodiment of a heat sink constructed according to the principles of the present invention.

Referring initially to FIG. 1, illustrated is an isometric view of one embodiment of a heat sink constructed according to the principles of the present invention. A heat sink 100 comprises a heat-conducting body 110 and a clamping arm 120. The heat sink 100 may be fabricated from a sheet of any suitable heat-conducting material; however, tin-plated or tin/lead-plated steel, copper, and aluminum are preferred materials. These materials are especially useful because they are: relatively inexpensive, good heat conductors, readily formed, common in the electronics industry and, with the exception of aluminum, may be readily soldered. Tin-plated or lead-plated steel is highly desirable because of very low cost and high structural strength.

In one embodiment, the heat-conducting body 110 is formed with first and second opposing edges 111, 112 and the clamping arm has first and second ends 121, 122. In a preferred embodiment, a compliant hinge 123 is integrally formed between the second edge 112 and the first end 121 of the clamping arm 220. A receiving catch 113 is formed at the first edge 111 of the heat-conducting body 110 that mates with a holding sear 124 formed in the second end 122 of the clamping arm 120. The heat sink 100 further includes one or more body flutes 115 that stiffen the heat-conducting body 110. The heat sink 100 may also include a clamping arm flute 125 that provides additional strength or stiffens the clamping arm 120.

In a preferred embodiment, the heat sink 100 further includes alignment bosses 130a, 130b, 130c, 130d, 130e, collectively designated 130, formed on an interior face 26 of the clamping arm 120. In an alternative embodiment, the alignment bosses 130, may be formed on a mounting face 117 of the heat-conducting body 110. In yet another embodiment, the alignment bosses 130 may be formed on both the clamping arm 120 and the heat-conducting body 110. The alignment bosses 130 are configured to receive and align an electrical, heat-generating component 140 having electrical leads 145. The heat sink 100 may further comprise solderable alignment tangs 150 that descend from a lower edge 116 of the heat-conducting body 110.

In the illustrated embodiment, a fiducial aperture 114 is formed in the heat-conducting body 110 to assist an assembler in placing the heat-generating component 140. The heatsink 100 may further include one or more heat-dissipating fins 170. One who is skilled in the art is familiar with the design and use of heat-dissipating fins on heat sinks.

Figure 2:
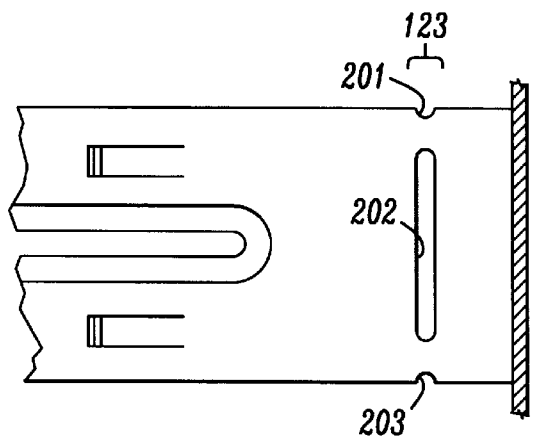
FIG. 2 illustrates a detail view of the compliant hinge of FIG. 1.

Referring now to FIG. 2, illustrated is a detail view of the compliant hinge of FIG. 1. A compliant hinge 123 is formed by relieving areas 201 and 203 defining a bend line for the arm 120. Area 202 may also be relieved if desired, but it is not always required. The compliant hinge 123 must be strong enough to prevent fatigue due to bending stresses generated when the arm is closed, yet permit hinge bending with relatively low force. One who is skilled in the art may readily perform the stress analysis to design such a compliant hinge 123.

Figure 3:
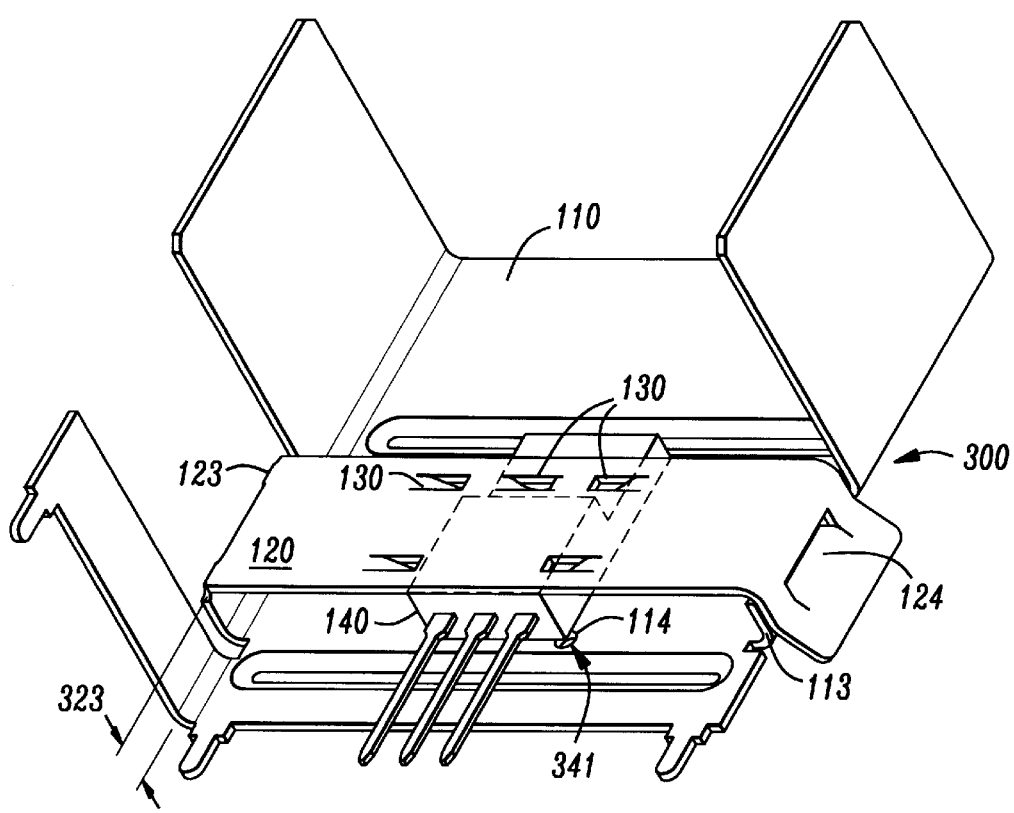
FIG. 3 illustrates an isometric view of an electrical, heat-generating component assembled to the heat sink of FIG. 1.

Referring now to FIG. 3 with continuing reference to FIG. 1, illustrated is an isometric view of an electrical, heat-generating component assembled to the heat sink of FIG. 1. A component/heat sink assembly 300 is assembled by placing the electrical, heat-generating component 140 on the heat-conducting body 110 with a lower, right corner 341 of the heat-generating component 140 aligned with the fiduciary aperture 114. The clamping arm 120 is folded about the compliant hinge 123 until the alignment bosses 130 capture the electrical, heat-generating component 140 and the holding sear 124 engages the receiving catch 113. A height 323 of the compliant hinge 123 is such that the electrical, heat-generating component 140 is held securely between the interior face 126 of the clamping arm 120 and the mounting face 117 of the heat-conducting body 110.

Figure 4:
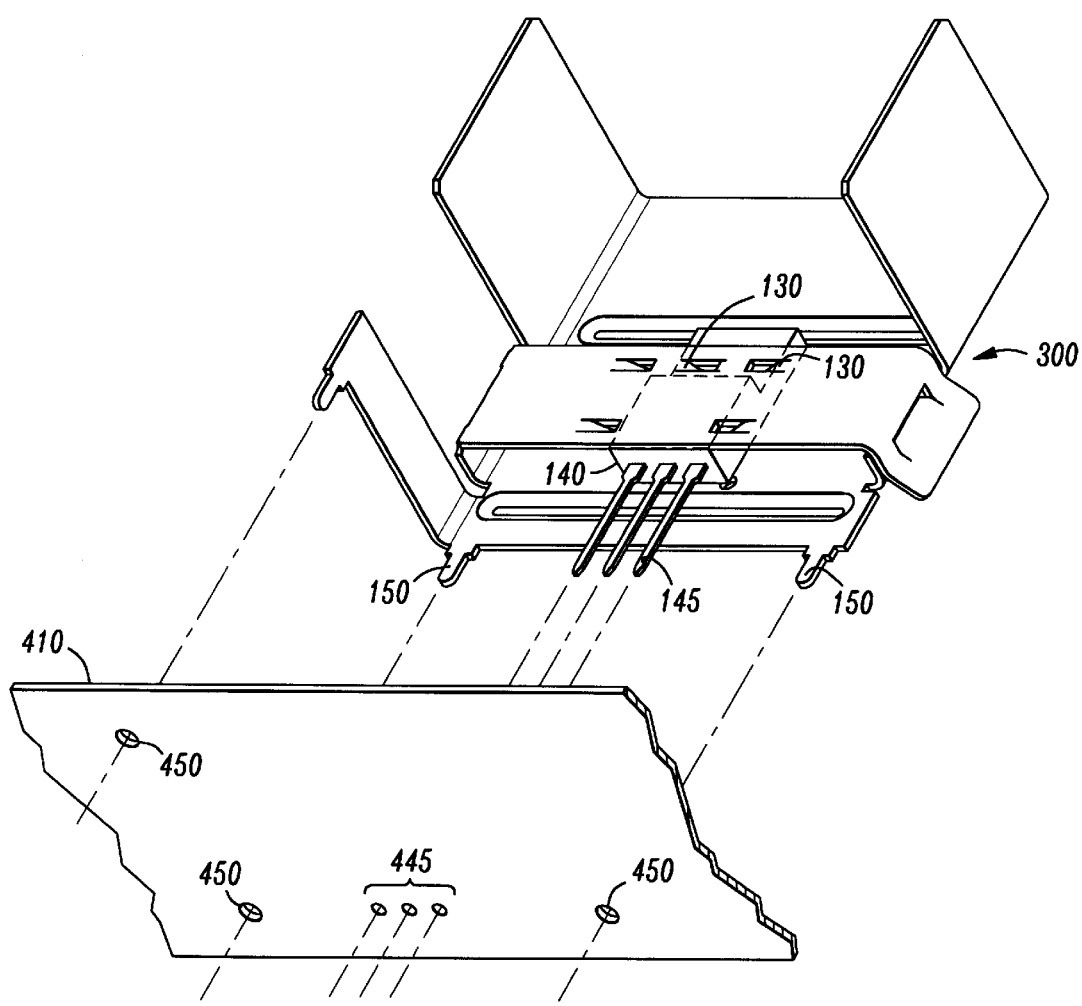
FIG. 4 illustrates an isometric view of the heat sink and component assembly of FIG. 3 proximate a printed wiring board.

Referring now to FIG. 4, illustrated is an isometric view of the heat sink and component assembly of FIG. 3 proximate a printed wiring board. The component/heat sink assembly 300 may be readily located on a printed wiring board 410 with the alignment tangs 150 extending into corresponding alignment apertures 450 and electrical leads 145 aligned with corresponding contact openings 445. The relative positions of alignment tangs 150, alignment bosses 130, and component leads 145 cooperate to facilitate assembly of the component/heat sink assembly 300 to the printed wiring board 410.

Thus, a heat sink 100 has been described that eliminates the need for adhesives, spring clamping devices, or hold-down brackets with a secondary mechanical fastener. The heat sink 100 is readily manufactured of sheet metal by stamping and forming. Assembling the heat-generating component 140 to the heat sink 100 is easily performed by a technician. In addition, the electrical component leads 145 and alignment tangs 150 of the component/heat sink assembly 300 readily align with contact openings 445 and alignment apertures 450, respectively, formed in a printed wiring board 410.

Although the present invention has been described in detail, those skilled in the art should understand that they can make various changes, substitutions and alterations herein without departing from the spirit and scope of the invention in its broadest form.

What is claimed is:

1. For use with an electrical component, a heat sink, comprising:

a heat-conducting body having first and second opposing edges and a support face configured to at least partially support an electrical, heat-generating component, said heat-conducting body further including a receiving catch coupled to said first edge; and a clamping arm having a mounting face with at least one pair of opposing alignment bosses formed thereon, said mounting face opposing said support face when said clamping arm is in a locked position, said clamping arm further having a first end hinged to said heat-conducting body at said second edge and a second end configured to cooperatively engage said receiving catch and maintain said clamping arm in said locked position, said alignment bosses cooperatively positioned to align an electrical lead of said electrical component to a corresponding alignment aperture formed in a printed wiring board when said electrical component is retained by said heat sink.

2. The heat sink as recited in claim 1 wherein said clamping arm has an interior face that opposes said heat-conducting body when said clamping arm is in said locked position and said alignment bosses are formed on said interior face.

3. The heat sink as recited in claim 1 wherein said heat-conducting body includes a fiducial aperture, said fiducial aperture configured to align said electrical heat-generating component in a position to cooperatively engage said alignment bosses.

4. The heat sink as recited in claim 1 further comprising alignment tangs, each of said alignment tangs configured to engage a corresponding alignment aperture formed in a printed wiring board.

5. The heat sink as recited in claim 1 further comprising a heat-dissipating fin.

6. The heat sink as recited in claim 1 further comprising a compliant hinge integrally formed with said heat-conducting body and said clamping arm.

7. The heat sink as recited in claim 1 further comprising alignment bosses and alignment tangs, said alignment bosses and alignment tangs cooperatively positioned to align an electrical lead of said electrical component to a corresponding alignment aperture formed in a printed wiring board when said electrical component is retained by said heat sink.

8. The heat sink as recited in claim 1 wherein said heat-conducting body includes a body flute, said body flute configured to stiffen said heat-conducting body.

9. The heat sink as recited in claim 1 wherein said clamping arm includes a clamping arm flute, said clamping arm flute configured to stiffen said clamping arm.

10. The heat sink as recited in claim 1 wherein said heat-conducting body and said clamping arm are formed from a metal selected from the group consisting of:
   aluminum,
   copper, and
   steel.

11. A printed wiring board, comprising:
   electrical components mounted on and electrically connected to said printed wiring board; and
   a heat sink mounted on said printed wiring board and including:
      a heat-conducting body having first and second opposing edges and a support face and a receiving catch coupled to said first edge;
      a clamping arm having a mounting face with at least one pair of opposing alignment bosses formed thereon, said mounting face opposing said support face when said clamping arm is in a locked position, said clamping arm further having a first end hinged to said heat-conducting body at said second edge and a second end configured to cooperatively engage said receiving catch and maintain said clamping arm in a locked position; and
   a heat-generating electrical component retained on said heat sink and maintained in a position by said alignment bosses and said clamping arm, said heat-generating electrical component having electrical leads extending therefrom with each of said electrical leads received in a corresponding contact opening formed in said printed wiring board, said alignment bosses positioned to align each of said electrical leads with said corresponding contact opening.

12. The printed wiring board as recited in claim 13 wherein said alignment bosses are formed on said heat-conducting body.

13. The printed wiring board as recited in claim 13 wherein said alignment bosses are formed on said clamping arm.

14. The printed wiring board as recited in claim 13 wherein said heat sink further comprises a fiducial aperture, said fiducial aperture configured to align said heat-generating electrical component in a position to cooperatively engage said alignment bosses.

15. The printed wiring board as recited in claim 13 wherein said heat sink further comprises alignment tangs, said alignment tangs configured to engage corresponding alignment apertures formed in said printed wiring board.

16. The printed wiring board as recited in claim 13 further comprising a compliant hinge integrally formed with said heat-conducting body and said clamping arm.

17. A method of fabricating a heat sink, comprising:
   forming a heat-conducting body having first and second opposing edges and a support face and a receiving catch coupled to said first edge; and
   forming a clamping arm having a mounting face with at least one pair of opposing alignment bosses formed thereon, said mounting face opposing said support face when said clamping arm is in a locked position, said clamping arm further having a first end hinged to said heat-conducting body at said second edge and a second end configured to cooperatively engage said receiving catch and maintain said clamping arm in said locked position, said alignment bosses cooperatively positioned to align an electrical lead of an electrical component to a corresponding alignment aperture formed in a printed wiring board when the electrical component is retained by said heat sink.

18. The method as recited in claim 17 further comprising forming a fiducial aperture to align said electrical heat-generating component in a position to cooperatively engage said alignment bosses.

19. The method as recited in claim 17 further comprising forming alignment tangs on said heat-conducting body, said alignment tangs configured to engage corresponding alignment openings formed in a printed wiring board.

20. The method as recited in claim 17 further comprising forming a heat-dissipating fin on said heat-conducting body.

21. The method as recited in claim 17 wherein forming a clamping arm further includes integrally forming a compliant hinge with said heat-conducting body and said clamping arm.

22. The method as recited in claim 17 further comprising forming alignment bosses and alignment tangs, said alignment bosses and alignment tangs cooperatively positioned to align an electrical lead of said electrical component to a corresponding alignment aperture formed in a printed wiring board when said electrical component is retained by said heat sink.

23. The method as recited in claim 17 wherein forming a heat-conducting body includes forming a body flute, said body flute configured to stiffen said heat-conducting body.

24. The method as recited in claim 17 wherein forming a clamping arm includes forming a clamping arm flute, said clamping arm flute configured to stiffen said clamping arm.

25. The method as recited in claim 17 wherein forming a heat-conducting body includes forming a sheet of metal selected from the group consisting of:
   aluminum,
   copper, and
   steel.

* * * * *